(12) United States Patent
Weller

(10) Patent No.: US 7,072,804 B2
(45) Date of Patent: Jul. 4, 2006

(54) DIGITAL TRIGGER FILTER FOR A REAL TIME DIGITAL OSCILLOSCOPE

(75) Inventor: Dennis J. Weller, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 163 days.

(21) Appl. No.: 10/952,311

(22) Filed: Sep. 28, 2004

(65) Prior Publication Data

US 2006/0074607 A1     Apr. 6, 2006

(51) Int. Cl.
*G06F 19/00*     (2006.01)

(52) U.S. Cl. .......................... 702/190; 702/57; 702/70; 324/76.11; 324/76.12

(58) Field of Classification Search .................... None
See application file for complete search history.

(56) References Cited

U.S. PATENT DOCUMENTS

| | | | | | |
|---|---|---|---|---|---|
| 4,823,076 | A | * | 4/1989 | Haines et al. | 324/121 R |
| 5,184,062 | A | * | 2/1993 | Ladwig | 324/74 |
| 5,375,067 | A | * | 12/1994 | Berchin | 702/66 |
| 5,414,635 | A | * | 5/1995 | Ohta | 702/67 |
| 5,438,531 | A | * | 8/1995 | Shank | 708/313 |
| 5,930,745 | A | * | 7/1999 | Swift | 702/190 |
| 5,978,742 | A | * | 11/1999 | Pickerd | 702/66 |
| 6,279,130 | B1 | * | 8/2001 | Moser | 714/724 |
| 6,615,148 | B1 | * | 9/2003 | Pickerd | 702/66 |
| 6,753,677 | B1 | * | 6/2004 | Weller et al. | 324/121 R |
| 6,760,673 | B1 | * | 7/2004 | Genther et al. | 702/75 |
| 6,915,218 | B1 | * | 7/2005 | Pickerd | 702/57 |
| 6,970,118 | B1 | * | 11/2005 | Regier | 341/118 |
| 7,034,517 | | * | 4/2006 | Newcombe | 324/115 |
| 2002/0147554 | A1 | * | 10/2002 | Pickerd | 702/66 |
| 2002/0171408 | A1 | * | 11/2002 | Hansen | 324/76.15 |
| 2004/0119620 | A1 | * | 6/2004 | Tran et al. | 341/126 |
| 2004/0176921 | A1 | * | 9/2004 | Lacy et al. | 702/78 |
| 2004/0236527 | A1 | * | 11/2004 | Felps | 702/67 |
| 2005/0225310 | A1 | * | 10/2005 | Smith et al. | 324/121 R |
| 2005/0246113 | A1 | * | 11/2005 | Montijo et al. | 702/57 |
| 2006/0015862 | A1 | * | 1/2006 | Odom et al. | 717/168 |
| 2006/0020407 | A1 | * | 1/2006 | Montijo et al. | 702/67 |
| 2006/0080065 | | * | 4/2006 | Pupalaikis et al. | 702/189 |

OTHER PUBLICATIONS

Various Internet Web pages from: www.bitscope.com entitled "Trigger Control", date unknown.*
Various Internet Web pages from www.measurementcomputing.com entitled "DASYlab", date unknown.*
Various Internet Web pages from www.lecroy.com regarding LeCroy Oscilloscopes, date unknown.*
National Instruments Application Note 177 dated Jan. 2002.*

* cited by examiner

*Primary Examiner*—Patrick J. Assouad

(57) ABSTRACT

A real time DSO is equipped with a Digital Trigger Filter that performs high frequency rejection, low frequency rejection, AC and DC triggering. The Digital Trigger Filter includes first and second digitally implemented IIR (Infinite Input Response) Filters. A digitized Conditioned Input Signal is applied to the first IIR Filter. It has taps that provide the Trigger Signal outputs needed for high and low frequency rejection. The high frequency rejection output of the first ER Filter is essentially a low pass output (3 dB down at 50 KHz) and is also used as the digital input to the second IIR Filter, whose output is a much more aggressive suppression of high frequencies (3 dB down at 50 Hz). The AC Trigger Signal output is produced by subtracting the output of the second IIR filter from the original input to the entire Digital Trigger Filter, and the DC Trigger Signal output is simply the same as that original input. A MUX selects which Trigger Signal is applied to a Digital Trigger Comparator.

11 Claims, 4 Drawing Sheets

DIGITAL TRIGGER FILTER FOR A REAL TIME DIGITAL OSCILLOSCOPE

BACKGROUND OF THE INVENTION

DSOs (Digital Sampling Oscilloscopes) can be divided into two broad classifications: those that operate using 'real time' and those that operate using 'equivalent time.' A real time DSO takes consecutive samples at a rate high enough to meet Nyquist criteria for even 'single shot' events that contain frequency components up to the bandwidth of the 'scope. And although a real time DSO will operate perfectly fine with repetitive inputs, there is no requirement that the input be repetitive to achieve full bandwidth. An equivalent time DSO cannot sample at the Nyquist rate, and relies upon the repetitive nature of the input to accumulate a replica of the input by sampling at a much lower rate, but at successively further locations along the input waveform, relative to a selected location identified by a trigger event.

Today, virtually all oscilloscopes are triggered, in contrast to the original technique of simply synchronizing a free-running sweep by adjusting its rate of repetition to produce a stable display. Indeed, in a modem DSO the notion of 'horizontal sweep' is almost an anachronism. The notion of 'triggering' has changed from when to start an instance of an analog time base to specifying a location in a time domain waveform that is understood as being a useful reference. That reference (the 'trigger location') can be selectively positioned within a displayed portion of that waveform, as reconstructed from digitized sample data stored in an acquisition memory. The idea is that the DSO is 'triggered' and that subsequently it will display a trace. The trigger event can occur before (what used to be called 'delayed sweep'), after (so-called 'negative time'), or during events represented by the displayed trace, depending upon such things as operator selection and the size of the acquisition memory. In any case, if there is no trigger event, then there is no displayed trace (unless an "AUTO" mode is in effect, wherein a trace is displayed at least every so often, even in the absence of a trigger event).

Correctly specifying the conditions under which the 'scope triggers is thus a very important task. It is made more complicated when the signal being observed contains many different components, or types of behaviors. To assist the operator in getting the 'scope to trigger as desired, it is common for the trigger event detection circuitry to be quite adjustable. Thus, it may include selection of AC or DC coupling, variable threshold detection (with hysteresis) for signal excursion, a refusal to re-trigger until a certain amount of time has past since the last trigger, and, of course, filters to either select or reject signal components based on frequency. The common term in use is 'trigger rejection,' although we should bear in mind that the choice of terminology is somewhat arbitrary, since what is 'selected' is whatever is not 'rejected.'

Conventional DSOs still use analog trigger filter circuitry, just as in the olden days of analog 'scopes. They are implemented with actual physical circuitry, and as such are limited in their range of operation by the dictates of circuit design and its compromises, they take space and generate heat, require adjustment, are susceptible of failure, and they cost money.

SUMMARY OF THE INVENTION

A real time DSO can be equipped with a Digital Trigger Filter that performs all the functions of an Analog Trigger Filter, including high frequency rejection, low frequency rejection, AC and DC triggering. The Digital Trigger Filter includes first and second digitally implemented IIR (Infinite Input Response) Filters.

Each IIR Filter includes a first adder that subtracts a retained version of the most recent output from the input, a multiplier that multiplies the difference by a constant (which may be accomplished by shifting bits if the constant is chosen to be related to a power of two), a second adder that adds a retained most recent output to the product of the multiplier, and a stage of retention that makes the output of the second adder become the next retained most recent output.

A digitized Conditioned Input Signal is applied to the first IIR Filter. It has taps that provide the Trigger Signal outputs needed for high and low frequency rejection. The high frequency rejection output of the first IIR Filter is essentially a low pass output (3 dB down at 50 KHz) and is also used as the digital input to the second IIR Filter, whose output is a much more aggressive suppression of high frequencies (3 dB down at 50 Hz). The AC Trigger Signal output is produced by subtracting the output of the second IIR filter from the original input to the entire Digital Trigger Filter, and the DC Trigger Signal output is simply the same as that original input. A MUX selects which Trigger Signal is applied to a Digital Trigger Comparator.

DESCRIPTION OF A PREFERRED EMBODIMENT

Figure 1:
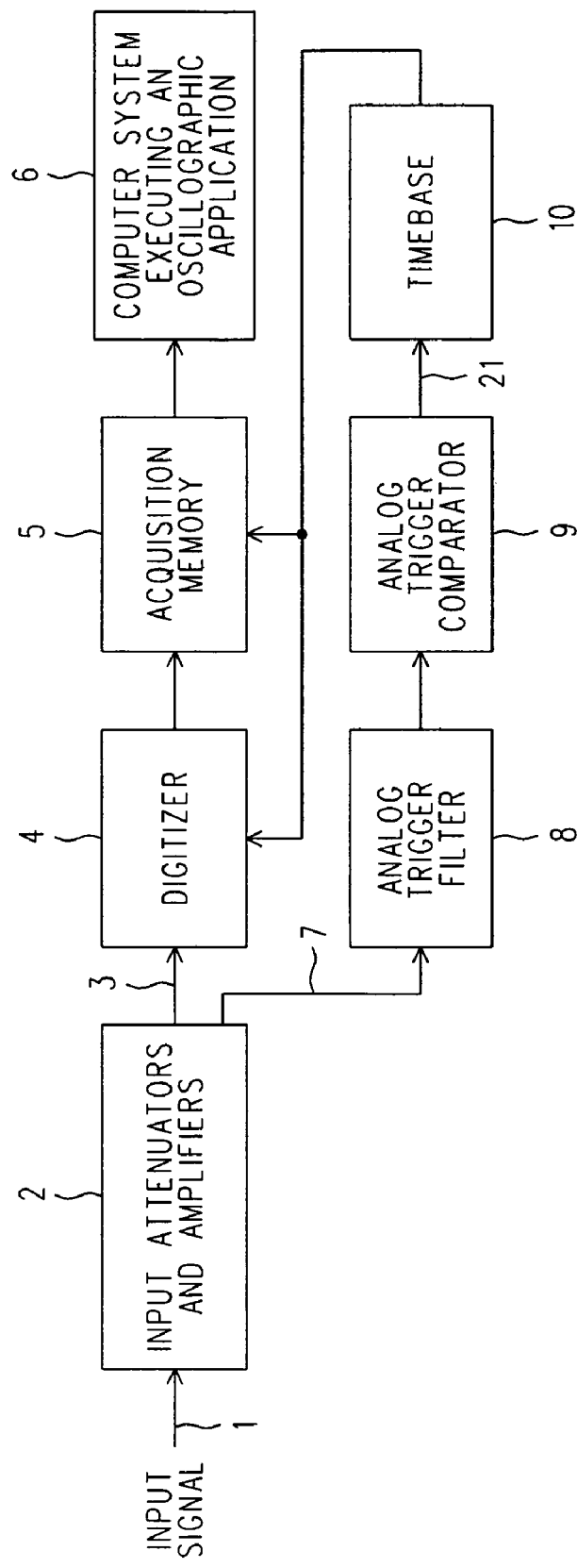
FIG. 1 is a simplified block diagram of a prior art DSO architecture that uses a conventional Analog Trigger Filter in conjunction with an Analog Trigger Comparator.

Refer now to FIG. 1, wherein is shown a simplified block diagram of a prior art DSO architecture that uses a conventional Analog Trigger Filter. In particular, an Input Signal 1 in applied to various Input Attenuators and Amplifiers 2, where signal conditioning takes place. A Conditioned Input Signal 3, which will be a suitable replica of the Actual Input Signal 1, is applied to a Digitizer (or analog to digital converter) 4 whose output is a series of digital words (preferably integers) of a suitable number of bits, say eight or ten, depending upon the vertical resolution the DSO is to have. The series of digital words is applied to an Acquisition Memory 5 that stores them internally as an Acquisition Record (not shown).

A Computer System 6 executes an Oscillographic Application that implements the majority of the control settings for the 'scope, and interprets the Acquisition Record in light of those control settings. It then prepares a displayed trace with suitable annotations and other messages for the operator. The Computer system 6 is an embedded one in a traditional bench-top laboratory grade 'scope, and it will be understood and appreciated that, for the sake of brevity, we have suppressed the details of the user interface and the mechanisms by which the Oscillographic Application controls the operation of the DSO in response to indications from the operator.

The architecture shown in FIG. 1 is (and is for FIGS. 2–4 as well) also applicable in the case where the acquisition hardware for the 'scope is a 'faceless box' connected to a stand-alone computer through a suitable interface. (It will be appreciated that in such a situation there is A LOT of traffic over that interface . . . .) While not as popular as they were at one time, they still exist, and the improvement we are about to describe is equally applicable to that architecture, as well.

The rates of taking the digital samples by the Digitizer 4 and of their storage in the Acquisition Memory 6 is determined by a Time Base 10. The Digitizer might sample only in response to transitions in a signal from the Time Base, after which the sample is stored in the Acquisition Memory, or the Digitizer might operate at full speed, but with only every $n_{th}$ sample being stored (so-called 'decimation'). To continue, the usual technique is for the Acquisition Memory to function as a circular structure, where the earliest stored data is overwritten once the Acquisition Memory is full. This behavior continues until a trigger event occurs, whereupon some preselected number of further samples is stored, followed then by the interpretation of the completed Acquisition Record and the preparation and display of a trace.

In the block diagram of FIG. 1, a version 7 of the Conditioned Input Signal is applied to an Analog Trigger Filter 8. This circuitry is mostly actual analog filters of the high-pass and/or low pass variety, and one or more of these is selected to operate on the Conditioned Input Signal 7. The filtered result is applied to an Analog Trigger Comparator 9, which may be essentially a high speed adjustable threshold detector, whose output is a Time Base Trigger 21.

The Time Base Trigger 21 may be applied to the Time Base 10. It is not so much (as it was in the old analog 'scopes) that the Trigger Signal 'turns on' or starts the Time Base—it was already doing what it needs to do to facilitate the sampling of the Actual Input Signal 1 and the storing of the Acquisition Record, as mentioned above. Instead, the DSO mayrecognize that: (1) Subsequent to the trigger event one or more stored samples need to be associated with that trigger and that a certain number of additional samples might still need to be acquired and stored, after which the Acquisition Record is complete; and, (2) The trigger event (as indicated by an edge in the Trigger Signal) is not constrained to occur only at times when a sample is taken. The implication is that the trigger event might not be explicitly contained in the Acquisition Record, but is actually located between two adjacent entries in the Acquisition Record. Nevertheless, it is desired to correctly indicate where on the displayed trace the trigger event happened. To do this we need to know (and keep track of) a time offset between the when the trigger event occurred and the adjacent active edges from the Time Base.

After the acquisition Record has been formed, the Oscillographic Application renders a trace according to the control settings that have been established by the operator.

As an aside, we offer the following comment on the operation of the architecture just described. It would be possible for the computer mechanism and the Oscillographic Application it executes to be intimately involved in controlling every little detail—for all of the 'smarts' to be in that program, as it were, and for all the hardware to be as 'dumb' as possible. That puts a large burden on the program, and it may not be economical for it to run fast enough to properly control a 'scope that takes high speed measurements.

Figure 2:
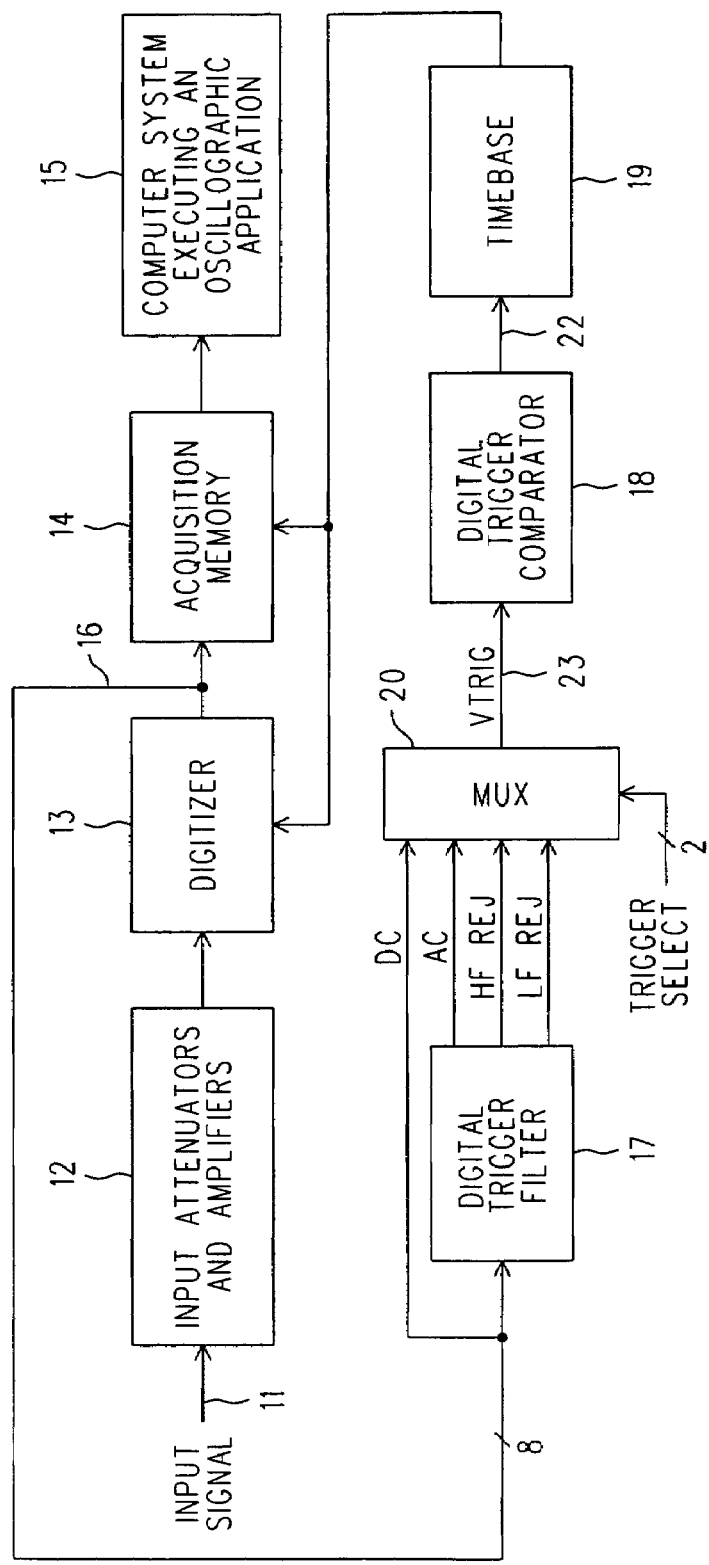
FIG. 2 is a simplified block diagram of an improved real time DSO using a Digital Trigger Filter in conjunction with a Digital Trigger Comparator.

Accordingly, hardware blocks shown in FIGS. 1 and 2 are as 'smart' as possible. They get told their operational parameters and then they carry them out. So, for example, the Acquisition Memory knows ahead of time how many more samples to store once the trigger signal has occurred. The idea is to off-load the high speed decision making to circuits associated with the decision and that already operate at high speed, and allow a relatively slow application program to worry mostly about things that happen before or after the actual measurement, such as conducting the user interface and post processing the data to render a trace. It is this latter 'smart hardware' arrangement that is preferred, and it also helps explain why we don't show an extensive collection of control lines between the Computer System 6 (or 15 in FIG. 2) and the rest of the hardware. Furthermore, it will be appreciated that the exact division of labor between the various hardware blocks varies from one DSO vendor to the next, and that if we appreciate the overall result, we needn't be too concerned over the details of any particular strategy.

Now consider the block diagram of FIG. 2. In many respects it is similar to that of FIG. 1, and is a simplified block diagram of a DSO having a Digital Trigger Filter. In particular, an Input Signal 11 in applied to various Input Attenuators and Amplifiers 12, where signal conditioning takes place. A Conditioned Input Signal is applied to a Digitizer 13 whose output is a series of digital words applied to an Acquisition Memory 14 that stores them as an Acquisition Record (not shown).

A Computer System 15 executes an Oscillographic Application that, as before, implements the majority of the control settings for the 'scope, and interprets the Acquisition Record in light of those control settings. It then prepares a displayed trace with suitable annotations and other messages for the operator.

The rate of taking the digital samples by the Digitizer 13 and their storage in the Acquisition Memory 14 is determined by a Time Base 19. The Digitizer might sample only in response to transitions in a signal from the Time Base, after which the sample is stored in the Acquisition Memory, or the Digitizer might operate at full speed, but with only every $n_{th}$ sample being stored. As before, the Acquisition Memory functions as a circular structure, where the earliest stored data is overwritten once the Acquisition Memory is full. This behavior continues until a trigger event occurs, whereupon some preselected number of further samples is stored, followed then by the interpretation of the completed Acquisition Record and the preparation and display of a trace.

In the block diagram of FIG. 2, the digitized version 16 of the Conditioned Input Signal is applied to a Digital Trigger Filter 17, the nature of which (FIG. 3) will be described in due course. The filtered result (a signal VTRIG 23) is applied to a Digital Trigger Comparator 18, which will be described in turn, and in connection with FIG. 4. The output of the Digital Trigger Comparator 18 is a Time Base Trigger 22 that may be applied to the Time Base 19.

Figure 3:
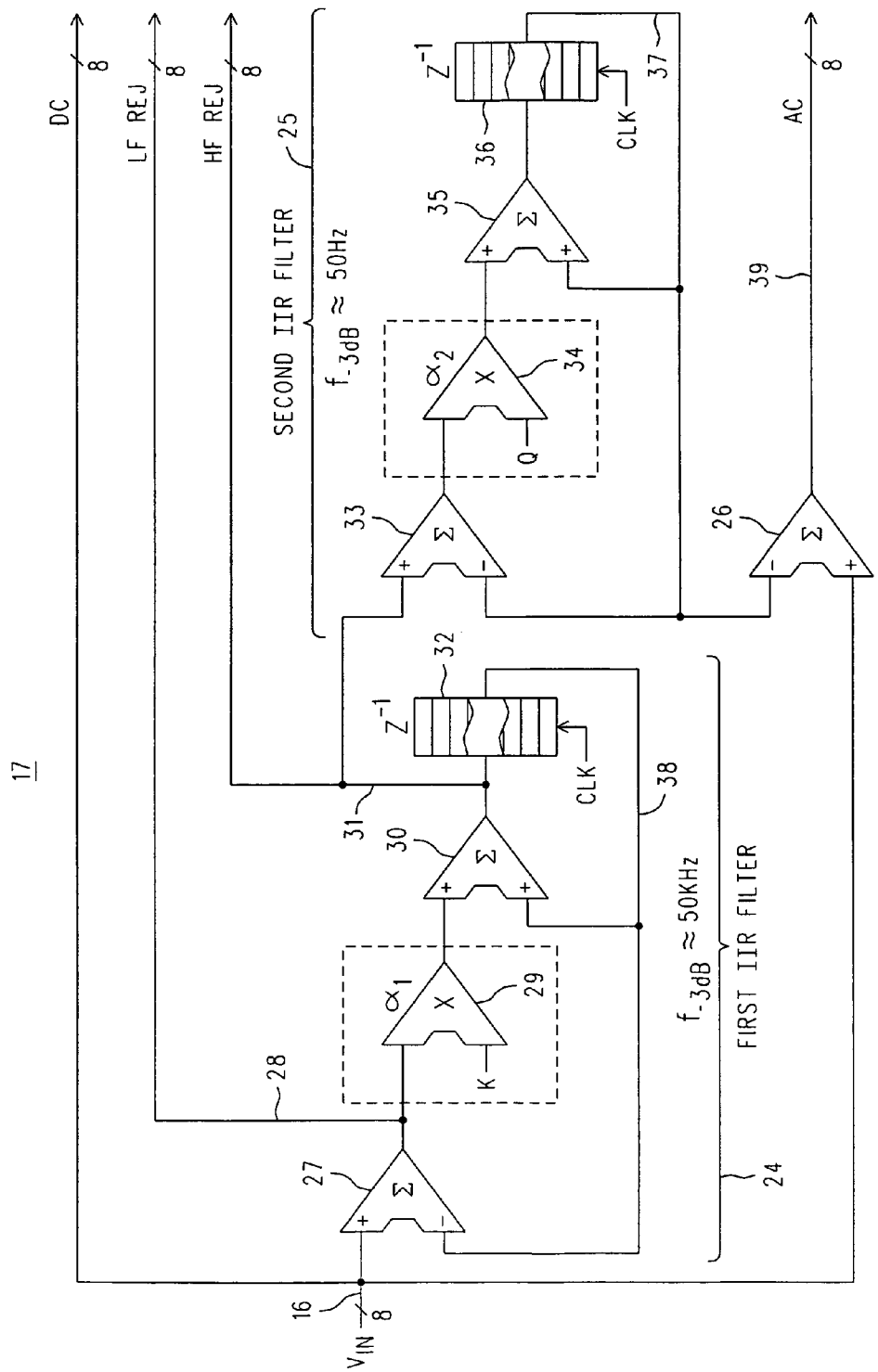
FIG. 3 is a simplified block diagram of a Digital Trigger Filter usable in the block diagram of FIG. 2.

Before turning to FIG. 3, note that the outputs of the Digital Trigger Filter 17 are an AC Trigger Signal, an HF REJ Trigger Signal and a LF Trigger Signal. (HF REJ stands for high frequency reject, while LF REJ stands for low frequency reject.) These signals are all digitally expressed integer values, in that their corresponding time-variant analog value is represented by a series of contemporaneous collections of bits (e.g., a two's complement binary number whose value changes in realtime). In addition, a DC Trigger Signal is available simply by routing the digitized Conditioned Input Signal around the Digital Trigger Filter.

A MUX 20, in response to a Trigger Select signal (of two or more bits) selects one of the aforementioned Trigger Signals to become VTRIG 23 (Vertical Trigger). VTRIG is applied to the Digital Trigger Comparator 18. (It will be appreciated that the four—or even more—Trigger Signals and a switch to select one thereof to be applied to the Trigger Comparator is a customary arrangement that exists even in analog implementations, such as FIG. 1. For the sake of brevity we didn't include it there.)

At this point it will be appreciated that, as far as outward operational aspects and capabilities are concerned, the two block diagrams of FIG. 1 and FIG. 2 are essentially equivalent. Where they differ is in how each of the Trigger Filter and the Trigger Comparator function internally.

The internal operation of the Digital Trigger Filter 17 of FIG. 2 may be understood with reference now to FIG. 3. It includes a First IIR Filter 24 that receives the digitized Conditioned Input Signal 16 as its input and a version (HF REJ 31) of whose output is applied as the input to a Second IIR Filter 25. An intermediate output (28) from the First IIR Filter 24 is the LF REJ Trigger Signal. The difference between the output 37 of the Second IIR Filter 25 and the applied input 16 is the AC Trigger Signal 39, while as already mentioned, the applied input 16 is taken as the DC Trigger Signal. For both filters 24 and 25 each of the signals mentioned is implemented as a sequence of digital numeric values. In a preferred embodiment they may be eight bit two's complement binary integers.

The First IIR Filter has a low frequency rejection tap and the First and Second IIR Filters each also have a high frequency rejection tap that is essentially a high pass filter that rolls off at 20 dB/decade and whose cut-off frequency is determined by the selection of a constant (K, or $\alpha_1$, for filter 24 and Q, or $\alpha_2$, for filter 25). For the First IIR Filter 24 a preferred cut-off frequency for the HF REJ tap is 50 KHz, while the corresponding cut-off frequency for the Second IIR Filter 25 is 50 Hz. The operation of each of the IIR Filters is similar, and it will be sufficient to explain in detail only one of them, say, the First IIR Filter 24.

The input 16 to the First IIR Filter 24 is a sequence of eight-bit binary two's complement integers. It is applied to the +input of an adder 27 whose other (−) input receives the most recent output (38) from the Filter 24, which is also a sequence of integer numeric values. The difference 28 between these two corresponding values from their respective sequences is formed by the adder 27 and is applied as one input factor to a multiplication (29) whose other factor is a constant (K/$\alpha_1$) selected as described below to produce the desired cut-off frequency. The resulting product is summed with the most recent output (38) in adder 30, and its output is captured in a register 32 whose output (after clocking) is the most recent output 38.

The operational principles of the Filter 24 may be appreciated by noting that the constant K (or $\alpha_1$) is generally less than one, so that what the Filter does is: Add some fraction of the latest change in the input to the most recent output. We note that, first, if the input remains steady ever smaller initial differences result in ever smaller products and the output converges to the input. To see this, assume some positive steady input with an output that is too low. A fraction of the positive difference is then added to the too low output, which is now larger than it was before, reducing the (next) initial difference. That is, the output is converging on the output. A similar explanation obtains for an initial output that is too high. Second, note that the more the input changes per clock cycle (dv/dt is larger) the greater the immediate change in the output, IF IT IS A STEADY STATE CHANGE IN THE INPUT, since such an alteration in the output can only accumulate according to the fractional multiplication. One the hand, a short period and alternating dv/dt will rapidly change the sign of the initial difference. The actual difference (28) will be the AC component, and is the LF REJ (high pass) output. Once multiplied by the multiplier 29, however, it (28) is greatly attenuated and is just ripple that causes the sum (31) produced by the adder 30 to oscillate about some average value. Thus, the sum 31 is a HF REJ (low pass) output, which is clocked into a register 32 for use as the retained most recent output that is used to form the initial difference (28). This behavior describes an infinite impulse filter, which in and of itself if conventional, and a more rigorous treatment of its properties can be found in the literature.

There are, however, a few more interesting things to point out here. First, we give a rule that will relate the value of K (same as $\alpha_1$) to the desired cut-off frequency:

$$\alpha = 2\pi (f_{-3\ dB})(t_{samp})$$

where $f_{-3\ dB}$ is the desired cut-ff frequency and $t_{samp}$ is the sampling period.

So, for a cut-off frequency of 50 KHz and a sampling period of 50 ps (Nyquist limit for a 10 GHz bandwidth), $\alpha_1$ (K) is 1.57 E-5. That is a pretty small number, so it can now be readily appreciated that the HF REJ output for the First IIR Filter 24 does indeed converge on a steady input at a rate that is much less than a signal of the shortest possible period. The same formula can be used to find a value for $\alpha_2$ (Q).

Next, we note that the architecture we are proposing is required to process the incoming digitized Conditioned Input Signal at the rate that the individual numeric values in the sequence leave the Digitizer 4. That is, we want the combination of the Digital Trigger Filter 17 and Digital Trigger Comparator 18 to operate in real time, just as their analog counterparts do. So, the arithmetic performed by the circuitry of the First (and Second) IIR Filter has to be performed very quickly. Integer addition and subtraction can indeed be performed very quickly. But the multiplication represented by multiplier 29 is another matter. In principle, it can be done, but it would likely be a very expensive solution to actually have an actual multiplier. We note that we need the speed more than we need precise accuracy, and opt to make the reciprocal of $\alpha_1$ be a power of two. This allows us to simply perform the multiplication by K through shifting the bits of the difference provided by the summer 27. This is the reason why we have enclosed the multiplier 29 in a dotted line box. In a preferred embodiment there is a bit-shift-induced multiplication, but no actual multiplier circuitry. What is more, we don't need a register there either: we can simply accomplish the shift by the manner in which the output bits of the adder 27 are placed into correspondence with the input bits for the adder 30.

Also, we have not indicated exactly how many bits of precision are used for the interior arithmetic. It will be understood that the amount of precision carried depends upon the kinds of operations and the degree to which precision needs to be preserved. This is well known, and it will be appreciated that some of the intermediate results inside the filters are two's complement integers of seventeen bits, even though we began and ended with but eight bits.

Now, it will at this point be readily appreciated that the Second IIR Filter 25 operates in the same way as the First, except that its input is the (non-delayed) output of the First. That is, the Second IIR Filter 25 includes an adder 33 whose +input is the HF REJ output 31 of the First IIR Filter, and whose other (−) input is the retained most recent output (37) as clocked into a register 36. The initial difference formed by adder 33 is multiplied by a constant Q (an $\alpha_2$) in a multiplier 34 (that is also implemented as a bit-shift-induced multiplication). The resulting fractional portion of the initial difference is then added by adder 35 to the most recent retained output 37. The main difference between the First and Second IIR Filters is in their values for K and Q, since the Second IIR Filter is to have a much lower cut-off frequency of 50 Hz.

It will be appreciated that other implementations of an IIR filter or other digital filter architectures could be employed.

It will be noted that the output of the Second IIR Filter is again that of a low pass filter, and functionally corresponds, save for some delay that is insignificant, to the HF REJ output 31 of the First IIR Filter. To obtain the AC Trigger Signal 39 the 50 Hz low pass output 37 is subtracted from the original Conditioned Signal Input 16. Thus, if that original input 16 is changing with frequency components significantly above 50 Hz, adder 26 will produce an output 39 indicative thereof since its (−) input will not contain them while the (+) input will experience those changing components.

As noted before, the DC Trigger Signal is simply the original (and thus unfiltered) digital Conditioned Signal Input 16.

Figure 4:
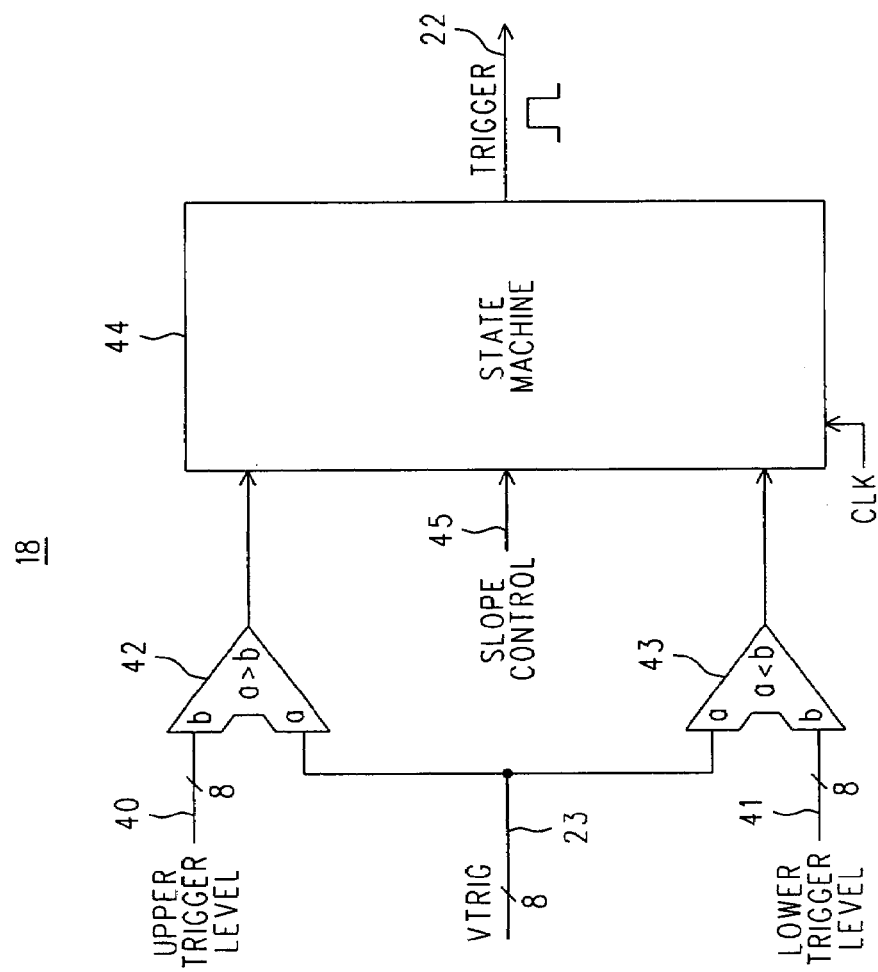
FIG. 4 is a simplified block diagram of a Digital Trigger Comparator usable with the Digital Trigger Filter of FIGS. 2 and 3.

Finally, we turn now to FIG. 4, which is a simplified block diagram of a Digital Trigger Comparator 18 that may be used in conjunction with the Digital Trigger Filter 17 of FIGS. 2 and 3. It is responsive to the signal VTRIG (Vertical Trigger) 23, which, it will be recalled, was selected to represent the desired trigger signal by MUX 20 (of FIG. 2) from among the filtered trigger signals (DC, AC, HF REJ and LF REJ) produced by the Digital Trigger Filter 17 whose explanation was just concluded.

Among other possible inputs (not shown for the sake of brevity) to the Digital Trigger Comparator 18 are VTRIG 23, an Upper Trigger Level 40 and a Lower Trigger Level 41. In a conventional manner, the Upper Trigger Level 40 and the Lower Trigger Level 41 track each other as the desired trigger level is varied by the operator, with the difference between them staying constant and representing a desired amount of hysteresis. The signal VTRIG is compared against each of the upper and lower trigger levels by respective comparators 42 and 43. Their outputs, and an indication of what the trigger slope is to be, are supplied to a State Machine 44 that decides when a trigger event has occurred, and that issues the signal Trigger 22 when it so decides. As previously explained, the signal Trigger 22 is applied to the Time Base 19.

It will be noted that, although we have illuminated a real-time DSO's architecture, other real time digital data acquisition apparatus can benefit from the digital trigger filtering technique described herein. Examples of such apparatus include, but are not limited to, waveform recorders and any other data acquisition system that stores, for an applied input signal, digitized sampled data as it is acquired and that is triggered by transitions in the time variant behavior of that applied input signal.

I claim:

1. Real time data acquisition apparatus comprising:
   an analog to digital converter that receives an applied signal to be acquired, the analog to digital converter producing, at a rate consonant with Nyquist requirements for a selected bandwidth, a sequence of digital numeric values corresponding to the time variant behavior of the applied signal;
   an acquisition memory coupled to the sequence of digital numeric values and that stores them as they occur;
   a digital trigger filter coupled to the sequence of digital numeric values and responsive to numerical value variations in the sequence of digital numeric values by producing a sequence of digitally filtered numeric values;
   a digital trigger comparator coupled to the sequence of digitally filtered numeric values and that produces a trigger signal when an excursion in the numeric values of the sequence of digitally filtered numeric values meets selected threshold, slope and hysteresis criteria; and
   wherein the acquisition memory stores a selected number, including none, of further entries in the sequence of digital numeric values subsequent to the occurrence of the trigger signal.

2. Apparatus as in claim 1 wherein the apparatus is a digital sampling oscilloscope and the applied signal is a conditioned version of an input signal applied to the apparatus.

3. Apparatus as in claim 1 wherein the apparatus is a digital sampling oscilloscope which further comprises an embedded computing system that executes an oscillographic application.

4. Apparatus as in claim 1 wherein the apparatus is a digital sampling oscilloscope which further comprises a separate computer that executes an oscillographic application.

5. Apparatus as in claim 1 wherein the apparatus is a waveform recorder.

6. Apparatus as in claim 1 wherein the digital trigger filter comprises a first digital filter whose input is the sequence of digital numeric values and having a first high frequency rejection tap and a first low frequency rejection tap, and the sequence of digitally filtered numeric values comprises a first stream of filtered numeric values taken from the first high frequency rejection tap and a second stream of filtered numeric values taken from the first low frequency rejection tap.

7. Apparatus as in claim 6 further comprising a selection switch whose inputs are the first and second streams of numeric values and having an output that is the input to the digital trigger comparator.

8. Apparatus as in claim 7 further wherein the sequence of digital numeric values from the analog to digital converter is also an input to the selection switch.

9. Apparatus as in claim 6 wherein the digital trigger filter further comprises a second digital filter whose input is the first stream of filtered numeric values and having a second high frequency rejection tap with a cut-off frequency substantially lower than a cut-off frequency for the first high frequency rejection tap and whose output is subtracted from the input to the second digital filter to produce a third stream of numeric values whose numeric variations correspond to AC filtering and the wherein the sequence of digitally filtered numeric values further comprises the third stream of numeric values.

10. Apparatus as in claim 9 further comprising a selection switch whose inputs are the first, second and third streams of numeric values and having an output that is the input to the digital trigger comparator.

11. Apparatus as in claim 10 further wherein the sequence of digital numeric values from the analog to digital converter is also an input to the selection switch.

* * * * *